United States Patent [19]  
Koch et al.

[11] Patent Number: 4,725,528  
[45] Date of Patent: Feb. 16, 1988

[54] PRODUCTION OF NON-TACKY, SMOOTH SURFACES OF PHOTOPOLYMER RELIEF PRINTING PLATES FOR FLEXOGRAPHIC PRINTING

[75] Inventors: Horst Koch, Grosskarlbach; Klaus-Peter Jaeckel, Oberkirch, both of Fed. Rep. of Germany

[73] Assignee: BASF Aktiengesellschaft, Ludwigshafen, Fed. Rep. of Germany

[21] Appl. No.: 876,791

[22] Filed: Jun. 20, 1986

[30] Foreign Application Priority Data

Jun. 20, 1985 [DE] Fed. Rep. of Germany ....... 3521955

[51] Int. Cl.$^4$ ............................................. G03F 7/00
[52] U.S. Cl. ..................................... 430/309; 430/306; 430/328; 430/286; 101/463.1; 101/467
[58] Field of Search ............... 430/306, 309, 325, 328, 430/331, 286; 101/463.1, 465, 467

[56] References Cited

U.S. PATENT DOCUMENTS

| 4,400,459 | 8/1983 | Gruetzmacher et al. | 430/306 |
| 4,400,460 | 8/1983 | Fickes et al. | 430/306 |
| 4,478,931 | 10/1984 | Fickes et al. | 430/309 |
| 4,603,058 | 7/1986 | Adams | 427/54.1 |

FOREIGN PATENT DOCUMENTS

| 0021829 | 1/1981 | European Pat. Off. | 7/10 |
| 0064565 | 11/1982 | European Pat. Off. | 7/2 |
| 0096835 | 12/1983 | European Pat. Off. | 7/26 |
| 0064564 | 11/1984 | European Pat. Off. | 7/2 |

Primary Examiner—John E. Kittle  
Assistant Examiner—José G. Dees  
Attorney, Agent, or Firm—Keil & Weinkauf

[57] ABSTRACT

Non-tacky, smooth, structureless surfaces of photopolymer relief printing plates for flexographic printing, whose relief layers are prepared in a conventional manner by exposing the photopolymerizable relief-forming layers of flexographic printing plates imagewise to actinic light and washing out the unpolymerized, unexposed areas with a suitable solvent, are produced by a process in which the flexographic printing plates are after-treated with a liquid medium which contains elemental bromine or is capable of forming elemental bromine, and then washed with a neutralization bath, one or more paraffinsulfonates, fatty alcohol ethersulfates or alkyl phosphates or a cationic or anionic surfactant possessing one or more perfluorinated carbon chains being employed in the bromine-containing, liquid medium.

The relief printing plates obtained according to the invention are used for flexographic printing.

4 Claims, No Drawings

PRODUCTION OF NON-TACKY, SMOOTH SURFACES OF PHOTOPOLYMER RELIEF PRINTING PLATES FOR FLEXOGRAPHIC PRINTING

The present invention relates to a process for the production of non-tacky, smooth surfaces of photopolymer relief printing plates for flexographic printing which, in the relief layer, contain one or more binders based on elastomeric diene polymers.

Photopolymerizable printing plates which contain one or more elastomeric diene polymers as binders in the relief-forming layer, and the production of releif plates from these, are well known. Examples of binders used are, in particular, thermoplastic elastomeric block copolymers of diene and vinylaromatic monomers, or elastomeric diene/acrylonitrile copolymers. In this context, reference may be made to German Published Application DAS 2,215,090 or German Laid-Open Application DOS 2,456,439. The photopolymer relief printing plates produced by imagewise exposure, washout and drying of these photopolymerizable printing plates have the disadvantage that they generally possess tacky surfaces which lead to picking and tearing of paper webs during printing. Moreover, fine image elements are blurred by picked paper fibers. Frequently, too, these tacky surfaces are not resistant to the solvents in which the printing inks are dissolved. This finally results in the destruction of the photopolymer relief printing plate during printing. A large number of solutions to this problem have been proposed. In this context, reference may be made to the following publications:

(1) German Laid-Open Application DOS 2,823,300,
(2) EP-A 21,829,
(3) EP-A 64,564,
(4) EP-A 64,565 and
(5) EP-A 96,835.

Reference may furthermore be made to the company document ® Cyrel Ststem, E.I. DuPont de Nemours and Co. Inc., Wilmington, page T-6, April 1975. (1) describes the after-treatment of photopolymer relief printing plates for flexographic printing, which contain styrene/isoprene block copolymers in their relief layer, with bromine-containing liquid media. (2) describes the iodination of flexographic printing plates, which contain natural and synthetic diene polymers, with iodine in aqueous potassium iodide solution. (3) claims the bromination of photopolymer relief printing plates, which contain elastomeric binders based on butadiene/acrylonitrile copolymers, with aqueous 0.1-3.5% strength by weight bromine solutions. The duration of bromination is from 15 seconds to 20 minutes. (4) states that aqueous solutions of an alkali metal monopersulfate and a bromine salt are used for the after-treatment of such relief printing plates. (5) recommends an after-treatment which comprises bromination or iodination followed by chlorination of the surface of such photopolymer relief printing plates. Finally, the abovementioned company document describes after-treatment with hypochlorite solutions containing hydrochloric acid. All of the stated processes reduce the tackiness of the surface of the said printing plates and make them more resistant to solvents for printing inks. However, the surfaces are not rendered uniformly tackfree. Visual observation of such surfaces leaves the impression of a worm-like structure whose contrast is further increased by the abovementioned after-treatment with bromine or chlorine. Moreover, when the residual bromine, iodine or chlorine is washed away, traces of drops are formed on such surfaces. During printing, these surface structures produce a noticeably unattractive effect in the resulting print. Moreover, photopolymer relief printing plates whose surfaces possess such structures become tacky again during relatively long print runs.

It has thus finally been found that the prior art processes for the after-treatment of photopolymer relief printing plates give unsatisfactory results. This is due in particular to the specific properties of the after-treatment baths used. These are often distributed non-uniformly over the surface to be treated and thus lead to non-uniform halogenation. Furthermore, the result of the after-treatment is highly dependent on the method and time of preparation of the treatment baths usually employed: solutions containing elemental halogen are generally very unstable and have only a short useful life. If they are not used at the correct time, particularly poor, unpredictable results are obtained. This makes it essential for the time of bath preparation and the time when the after-treatment is carried out to be coordinated exactly. In practice, however, such coordination does not always take place. To improve the wetting properties of hypochlorite solutions containing hydrochloric acid, the abovementioned company document recommends the addition of wetting agents. The nature of the wetting agents is not specified. These after-treatment solutions must be used immediately after mixing, the maximum shelf life being only 30 minutes. Moreover, they do not give smooth, structureless surfaces on relief printing plates and therefore do not completely overcome the above disadvantages.

It is an object of the present invention as far as possible to overcome the disadvantages of the conventional after-treatment methods for photopolymer relief printing plates for flexographic printing, and to provide an after-treatment for such plates which is easy to carry out and which gives printing plates which are uniformly non-tacky, possess a structureless, smooth surface and do not become tacky again even after relatively long print runs by the flexographic method. It is a further object of the present invention to provide after-treatment baths which have a long useful life.

We have found, surprisingly, that this object is achieved by a process for the production of non-tacky, smooth surfaces of photopolymer relief printing plates for photographic printing whose relief layers are prepared by (A) exposing a photosensitive photopolymerizable and/or photocrosslinkable relief-forming layer imagewise to actinic light, the said layer containing
  (a) one or more binders based on elastomeric diene polymers,
  (b) one or more olefinically unsaturated, photopolymerizable and/or photocrosslinkable monomers which are compatible with the said binders,
  (c) one or more photoinitiators and
  (d) if required, conventional assistants and/or additives,
(B) washing out the non-photopolymerized and/or non-crosslinked, unexposed areas with a suitable liquid medium,
(C) if necessary, then carrying out drying and/or
(D) post-exposing the resulting relief printing plate to actinic light, in which (E) the surface of the photopolymerized relief printing plate is after-treated with a liquid medium which contains one or more surfactants and elemental bromine or contains one or more surfactants and is capable of forming elemental bromine, and thereafter, (F) the surface of the photopolymerized relief printing plate is washed out with a neutralizing and/or reducing liquid medium and, if required, (G) the photopolymerized relief printing plate after-treated in this manner is dried and/or (H) post-exposed to actinic light, unless this has been carried out in step D.

In the process according to the invention, the liquid media used for step E contain one or more surfactants from the group consisting of saturated paraffinsulfonates possessing a hydrocarbon chain of 8 to 20 carbon atoms, anionic or cationic surfactants possessing one or more perfluorinated carbon chains of 5 to 18 carbon atoms, fatty alcohol ethersulfates and alkyl phosphates.

In a preferred embodiment of the invention, the liquid medium used for step E contains a saturated paraffinsulfonate, an anionic or cationic surfactant possessing a perfuorinated carbon chain, a fatty alcohol ethersulfate or an alkyl phosphate, in an amount of from 0.001 to 1% by weight, based on the total amount of the liquid medium.

The present invention also relates to a process of this type in which, furthermore, the liquid media used for step F contain one or more saturated paraffinsulfonates possessing a carbon chain of 8 to 20 carbon atoms or an anionic or cationic surfactant possessing one or more perfluorinated carbon chains of 5 to 18 carbon atoms, a fatty alcohol ethersulfonate and/or an alkyl phosphate, preferably in amounts of from 0.001 to 1% by weight, based on the total amount of the particular liquid media.

Furthermore, we have found, surprisingly, that the useful life of the after-treatment baths can be dramatically increased by using these selected surfactants.

The novel after-treatment by steps E and F can be carried out on photopolymer relief printing plates whose relief layers have been prepared by steps A and B or A to D. However, it is quite possible for the novel after-treatment of the said relief printing plates by steps E and F to be followed by steps G and/or H. In a preferred procedure, photopolymer relief printing plates whose relief printing layers have been prepared by steps A and B are after-treated by steps E and F. Photopolymer relief printing plates produced and after-treated in this manner can then be subjected to steps G and/or H.

For the novel after-treatment, the relief printing plates to be treated can be immersed in the novel media or sprayed with these media, the former procedure being preferred.

A great advantage of the novel after-treatment of the surfaces of photopolymer relief printing plates for flexographic printing is that non-tacky, smooth, structureless surfaces are obtained. Another decisive advantage of the novel process is the long useful life of the Liquid media used, which contain one or more of the above surfactants and elemental bromine or contain one or more of the above surfactants and are capable of forming elemental bromine. This surprisingly long useful life permits a substantial degree of freedom in the choice of the time of preparation of the after-treatment solution and hence the preparation of stocks.

The printing tests with the photopolymer printing reliefs treated according to the invention surprisingly show that the printing plates are extremely stable. Even with print runs of over one million, the surface remained tack-free. This is the case regardless of the type of printing ink solvent and constitutes very great progress. Consequently, tearing of the paper web is avoided, even during long print runs. The procedure for the novel process and the agents advantageously used for this procedure are described in detail below, and the advantages of the novel process are illustrated by means of typical examples.

In the present invention, for the after-treatment of photopolymer relief printing plates for flexographic printing, liquid media are used which contain one or more saturated paraffinsulfonates, an anionic or cationic surfactant possessing perfluorinated carbon chains, a fatty alcohol ethersulfate or an alkyl phosphate and elemental bromine, or contain one or more paraffinsulfonates of this type or another of the stated surfactants and are capable of forming elemental bromine. For the purposes of the present invention, a liquid medium is a pure solvent or a mixture of two or more solvents which may or may not contain further gaseous and/or solid dissolved substances, with the exception of bromine or one of the abovementioned surfactants. Accordingly, suitable media are conventionally employed aprotic polar solvents, e.g. diethyl ether, di-n-butyl ether, tetrahydrofuran, dioxane, acetone, methyl ethyl ketone, cyclohexanone, acetylacetone, ethyl acetate, ethyl acetoacetate, acetonitrile, propionitrile, etc. Other suitable media are conventionally employed protic polar solvents, e.g. methanol, ethanol, propanol, n-butanol, acetic acid, water, etc., as well as conventionally used non-polar solvents, such as chloroform, methylene chloride, perchloroethylene, etc. The list serves to illustrate the invention and does not impose any restrictions. The above solvents can be used alone or as a homogeneous mixture. In conformity with the definition, these liquid media can contain further substances for the purpose of the present invention. Suit-able media of this type are gases, e.g. hydrogen chloride, hydrogen bromide, oxygen, etc., or solids, such as inorganic and organic salts. Perchloroethylene, n-butanol or water is preferably used as a basis for liquid media or as the liquid media themselves. Water is very particularly preferably used.

The novel media contain elemental bromine or are capable of forming elemental bromine. The concentration of free elemental bromine in the after-treatment baths is preferably from 0.2 to 1% by weight, based on the total amount of the after-treatment bath. The elemental bromine may be added to the after-treatment bath or to the liquid medium in the form of elemental bromine as such, but may also be introduced in the form of a mixture of glacial acetic acid and elemental bromine. Bromine-donating bromine complexes, for example the dioxane-bromine complex (dioxane dibromide, cf. Chemical Abstracts 1953, Volume 47, No. 8032 h), pyridine hydrobromide dibromide or polyvinylpyrrolidone. $HBr_3$, are also suitable. In such cases, the abovementioned concentration is based on the amount of bromine donated. In addition to the above methods, it is also possible to produce elemental bromine in the liquid medium itself by reacting suitable reactants. Mixtures of a bromide, a bromate and an acid or mixtures of a bromide and an alkali metal monopersulfate, as described in, for example, European Pat. No. 64,565, are suitable for this purpose.

The after-treatment baths or the liquid media contain, as a component essential for the invention, a specific surfactant or a plurality of specific surfactants. The surfactants used for the novel process belong to the group consisting of the saturated paraffinsulfonates possessing a saturated hydrocarbon chain of 8 to 20 carbon atoms, the anionic or cationic surfactants possessing one or more saturated perfluorinated hydrocarbon chains of 5 to 18 carbon atoms, fatty alcohol ethersulfates and/or alkyl phosphates. These specific surfactants are preferably used in amounts of from 0.001 to 1% by weight, based on the total amount of the particular liquid medium. We have found that only surfactants of this type give the desired success in the process, and this is confirmed by comparative experiments.

The saturated paraffinsulfonates possessing a saturated hydrocarbon chain of 8 to 20 carbon atoms, and anionic or cationic surfactants containing one or more perfluorinated carbon chains of 5 to 18 carbon atoms, which are to be used according to the invention, include, for example, the alkylsulfonates and their salts, for example sodium dodecyl-, tridecyl-, tetradecyl-, pentadecyl-, hexadecyl-, heptadecyl-, octadecyl-, nonadecyl- and eicosanylsulfonate and potassium perfluoropentyl-, perfluorohexyl-, perfluoroheptyl-, perfluorooctyl-, perfluorononyl-, perfluorodecyl-, perfluoroundecyl-, perfluorododecyl-, p-fluorotridecyl-, perfluorotetradecyl-, perfluoropentadecyl-, perfluorohexadecyl-, perfluoroheptadecyl- and perfluorooctadecylsulfonate, and mixtures of these. Suitable fatty alcohol ethersulfates are those of 12 to 20 carbon atoms, for example alkali metal salts, such as sodium 3,6-dioxahexadecyl-, 3,6-dioxaheptadecyl-,3,6-dioxaoctadecyl-, 3,6-dioxanonadecyl-, 3,6-dioxaeicosanyl-, 3,6-dioxaheneicosanyl- and 3,6-dioxadocosanylsulfate. Suitable alkyl phosphates are fatty alcohol phosphoric acid monoesters of 8 to 20 carbon atoms and their mono- and di-alkali metal salts, e.g. sodium and disodium octyl-, nonyl-, decyl-, undecyl-, dodecyl-, tridecyl-, tetradecyl-, pentadecyl-, hexadecyl-, heptadecyl-, octadecyl-, nonadecyl-and eicosanylphosphate. Other surfactants, for example oxyethylated fatty alcohols, such as oxyethylated octanol, nonanol, decanol, undecanol, dodecanol, tridecanol, tetradecanol, pentadecanol, hexadecanol, heptadecanol, octadecanol, nonadecanol and eicosanol containing from 5 to 20, in particular 8, ethylene oxide units in the molecule, dimethylalkylbenzylammonium bromides, e.g. dimethyloctyl-, dimethylnonyl-, dimethyldecyl-, dimethylundecyl-, dimethyldodecyl-, dimethyltridecyl-, dimethyltetradecyl-, dimethylpentadecyl-, dimethylhexadecyl-, dimethylheptadecyl-, dimethyloctadecyl-, dimethylnonadecyl - and dimethyleicosanylbenzylammonium bromide, ethylene oxide/propylene oxide block copolymers, such as two-block ethylene oxide/propylene oxide copolymers which contain ethylene oxide blocks of from 5 to 200 ethylene oxide units and propylene oxide blocks of from 5 to 200 1,2-propylene oxide or 1,3-propylene oxide units, alkylglucosides, such as butyl-, pentyl-, hexyl-, heptyl-, octyl-, nonyl-, decyl-, undecyl-, dodecyl-, tridecyl-, tetradecyl-, pentadecyl-, hexadecyl-, heptadecyl-, octadecyl-, nonadecyl-, eicosanyl-, heneicosanyl-, docosanyl-, tricosanyl-, tetracosanyl-, pentacosanyl-α- and -β-D-glucoside, etc., may also be present.

Surfactants of the above type are well known and commercially available.

In the novel process, bromination of the surface of the developed photopolymer relief printing plate is followed by a further after-treatment with a neutralizing and/or reducing liquid medium which may contain one or more saturated paraffinsulfonates used in step E, a surfactant possessing a perfluorinated hydrocarbon chain, fatty alcohol ethersulfate and/or an alkyl phosphate. Suitable liquid media for this purpose are the abovementioned ones. Advantageously, the surfactants used are the same as those employed for the bromination baths. The neutralizing effect of the liquid medium is adjusted by adding basic substances. Suitable basic additives are alkali metal and alkaline earth metal hydroxides, carbonates, acetates, etc., and organic and inorganic nitrogen bases, eg. ammonia, triethylamine, etc. The reducing effect is obtained by adding reducing compounds. Compounds of this type which are particularly preferably used are sodium thiosulfate and sodium formaldehydesulfoxylate ($HOCH_2SOONa$). These compounds also have the advantage that they posses basic properties in addition to their reducing effect.

The liquid media of the stated type are used for washing out residual bromine from the surface of the brominated photopolymer relief printing plate. In a procedure preferred according to the invention, residual bromine is washed out using an aqueous solution which contains 1% by weight of sodium thiosulfate or of sodium formaldehydesulfoxylate ($HOCH_2SOONa$) and, if required, from 0.01 to 1% by weight of one or more of the above surfactants.

When the novel liquid media, which contain elemental bromine and one or more of the above surfactants or are capable of forming elemental bromine and contain one or more of the above surfactants, are used, immersion times of from 1 to 15, preferably from 1.5 to 10, in particular from 2.5 to 7, minutes are required for the after-treatment of the surface of photopolymer relief printing plates. When a liquid medium which contains sodium thiosulfate or sodium formaldehydesulfoxylate and may furthermore contain a surfactant is used for washing out residual bromine from the surface of the photopolymerized and brominated relief printing plates, from 5 to 60, preferably from 10 to 50, in particular from 15 to 40, seconds are required.

The novel process is particularly useful for the treatment of photopolymer relief layers of flexographic printing plates which have been produced in a conventional manner by exposing imagewise to actinic light photopolymerizable relief-forming layers of flexographic printing plates, containing (a) one or more binders based on elastomeric diene polymers, (b) one or more olefinically unsaturated, photopolymerizable or photocrosslinkable monomers which are compatible with these binders, (c) one or more photoinitiators and, if required, further nonpolymerizable or noncrosslinkable assistants and/or additives, and then developing the relief.

Elastomeric diene polymers which are particularly suitable as binders for the photopolymerizable relief-forming layers of flexographic printing plates are the corresponding polymers of conjugated aliphatic dienes of 4 or 5 carbon atoms. Examples of these are natural rubber, the homopolymers of butadiene and isoprene, copolymers of butadiene and isoprene with one another and the copolymers of butadiene and/or isoprene with other copolymerizable monomers, in particular styrene, acrylonitrile, alkyl (meth)acrylates where alkyl is of 1 to 8 carbon atoms, etc. Examples of such copolymers are the nitrile rubbers (e.g. butadiene/acrylonitrile copolymers containing from 15 to 40% by weight of acrylonitrile, which are described in, for example, EP-A 64,564 and may or may not contain carboxyl groups); random copolymers of styrene and butadiene and/or isoprene, preferably containing from 10 to 50% by weight of copolymerized styrene; and block copolymers of styrene monomers and butadiene and/or isoprene, as described in, for example, German Published Application DAS 2,215,090 and German Laid-Open Applications DOS 2,456,439 and DOS 2,942,183. Other advantageous binders are two-block copolymers of the A-B type and three-block copolymers of the A-B-A type, possessing one or two thermoplastic styrene polymer blocks A and an elastomeric butadiene and/or isoprene polymer block B and containing in general from 10 to 50% by weight of copolymerized styrene, as well as elastomeric three-block copolymers of the A-B-C type, possessing a thermoplastic, nonelastomeric styrene polymer block A, an elastomeric butadiene and/or isoprene polymer block B and an elastomeric polymer block C which differs from B and consists of butadiene and/or isoprene and, if appropriate, styrene, as are intended for use as binders, for example according to German Laid-Open Application DOS 2,942,183.

The styrene/isoprene three-block copolymers, also referred to as flexographic rubber IV, as described in German Laid-Open Application DOS 2,942,183, and butadiene/acrylonitrile copolymers according to EP-A 64,564 are preferably used. In a procedure preferred according to the invention, the photosensitive mixtures contain the block copolymers in amounts of from 60 to 99, in particular from 70 to 95, % by weight, based on the total amount of photosensitive mixture.

The photopolymerizable relief-forming layers of the photosensitive flexographic printing plates contain, as a further essential component, an olefinically unsaturated, photopolymerizable or photocrosslinkable monomer which is compatible with the elastomeric diene copolymer. In this connection, compatibility means the capability of two or more components to remain dispersed in one another without causing light scattering. Such compatibility is often restricted by the proportions of the components, and incompatibility becomes evident through the production of cloudiness or streaks in the photopolymerizable mixture. Although slight cloudiness can be tolerated in such mixtures under certain circumstances, such cloudiness should be completely avoided where a faithful reproduction of detail is desirable. The amount of olefinically unsaturated compounds added to the photosensitive mixture therefore depends primarily on the concentration which just avoids producing undesirable light scattering or cloudiness.

Particularly suitable monomers are the esters of acrylic acid and/or methacrylic acid with monohydric or polyhydric alcohols, such as n-butyl acrylate, n-butyl methacrylate, 2-ethylhexyl acrylate, 1,1,1-trimethylolpropane triacrylate, pentaerythritol tetraacrylate, diethylene glycol diacrylate, diethylene glycol dimethacrylate, lauryl acrylate, hydroxypropyl acrylate, etc. Other suitable compounds are N-vinyl compounds, such as N-vinylpyrrolidone, vinyl esters of aliphatic monocarboxylic acids, such as vinyl oleate, vinyl ethers of diols, such as butane-1,4-diol divinyl ether, as well as allyl ethers and allyl esters. The same applies to the reaction products of di- and polyepoxides, such as butane-1,4-diol diglycidyl ether or bisphenol A diglycidyl ether, with (meth)acrylic acid, provided that they are sufficiently compatible with the polymer. A mixture of acrylic acid derivatives and methacrylic acid derivatives is particularly advantageous for improving the resilience characteristics and the elongation at break of the relief printing plates and improving adhesion promotion in multi-layer plates. In general, by suitably choosing the monomers or mixtures of these, the properties of the relief printing plates prepared from them can be modified for the specific intended use. Accordingly, the above list is not intended to impose any restrictions but serves to illustrate the invention.

The photopolymerizable relief-forming layers of the flexographic printing plates furthermore contain a conventional photoinitiator, in general in an amount of from 0.01 to 10, in particular from 0.01 to 5, % by weight, based on the total amount of the photopolymerizable relief-forming layer, e.g. benzoin or benzoin derivatives, such as benzoin methyl ether or benzoin isopropyl ether, or benzil 1,1-acetals, such as benzil 1,1-dimethylacetal. However, the acylphosphine oxides, etc., which are effective photoinitiators are also suitable. The list serves to illustrate the invention and is not intended to impose any restriction. The skilled worker is familiar with the fact that a large number of other compounds can be used as photoinitiators provided that they absorb light in a wavelength range from 200 to 800 nm and liberate free radicals in the process.

The said relief-forming layers may furthermore contain other conventional additives, such as thermal polymerization inhibitors, e.g. p-methoxyphenol, hydroquinone or N-nitroso compounds, dyes, photochromic substances, antioxidants and plasticizers, the latter for improving the processability of the photopolymerizable relief-forming layers.

The thickness of the photopolymerizable relief-forming layers of the flexographic printing plates of the type described above, or of the photopolymerized relief layers of the flexographic printing plates which are formed from these, is advantageously from 200 to 2000 $\mu$m, in particular from 300 to 3000 $\mu$m. After photocrosslinking by total exposure to actinic light, preferred relief printing plates have a Shore A hardness of from 30 to 90, in particular from 40 to 70. The photopolymerizable relief-forming layers of the flexographic printing plates are particularly advantageously produced by casting from their solutions in suitable solvents, such as cyclohexane, toluene, xylene or tetrahydrofuran.

The photopolymerizable relief-forming layers of the above type, or the photopolymerized relief layers produced from them, can be supported on a dimensionally stable base or can be adhesively bonded to such a dimensionally stable base with the aid of an adhesion-promoting layer or films coated on both sides with adhesive. Suitable dimensionally stable bases are plastic films, e.g. polyester films, and metallic bases, e.g. steel sheet, iron sheet or aluminum sheet.

It is also advantageous to apply, onto the photopolymerizable relief-forming layers of the flexographic printing plates, a thin non-tacky outer layer which is adhesively bonded and preferably consists of a polymer which forms hard, non-tacky, transparent films of high tensile strength, for example a nylon or nylon copolymer which is soluble in the developer, a polyurethane or a mixture of such a polymer with a small amount (not more than 10% by weight) of a photopolymerizable monomer and a photoinitiator. The thickness of this outer layer is advantageously about 0.5–20 $\mu$m. Because of such an outer layer, no difficulties are encountered, and there is no danger of air bubbles being included or pressed in, when a negative is placed on top in the production of the relief printing plate from the multilayer plates, and imagewise exposure is carried out using commercial exposure units in which a vacuum foil presses the negative against the plate to be exposed, under slightly reduced pressure. It is furthermore often advantageous to provide the outer layer with a cover sheet which can be peeled off, such as a polyester film, and this may also be applied together with the outer layer onto the relief-forming layer. The cover sheet is generally removed prior to imagewise exposure.

The photopolymer flexographic relief printing plates used for the novel process can be produced from these photopolymerizable flexographic printing plates in a conventional manner by imagewise exposure to actinic light followed by removal, in particular, washing out, of the unexposed or noncrosslinked parts of the relief-forming layer. Suitable light sources for the imagewise exposure, which can be carried out using a flat-plate exposure unit or a rotary, cylindrical unit, are the conventional sources of actinic light, such as commercial UV fluorescent tubes or high-pressure mercury lamps. The wavelength emitted should preferably be from 300 to 400 nm or should be matched up with the intrinsic absorption of the photoinitiator present in the relief-forming layer consisting of a photosensitive mixture. Examples of suitable developers for developing the relief by washing out the noncrosslinked parts of the relief-forming layer are chlorohydrocarbons, such as trichloroethane, sym.-tetrachloroethane or tetrachloroethylene (also referred to as perchloroethylene), hydrocarbons, such as hexane or toluene, and other organic solvents, such as N-methyl-pyrrolidone, as well as mixtures of such solvents with lower alcohols for controlling the washout effect, and aqueous alkali metal hydroxide solutions and water.

The Examples which follow illustrate the process of the invention. In the Examples and comparative experiments, parts and percentages are by weight, unless stated otherwise.

To assess the success of the process measures, the following methods were used:

1. Test for tack

The surface tack of the flexographic printing plates was determined by touch and then rated as follows:

1: non tacky; 2: somewhat tacky; 3: substantially tacky; 4: very tacky.

2. Determination of the structure and smoothness of the surface of the flexographic printing plates The quality of the surface of after-treated, developed relief printing plates was determined with the aid of scanning electron micrographs, and assessed as follows:

1: smooth, structureless surface without worm-like structures; 2: substantially smooth, substantially structureless surface without worm-like structures; 3: substantially smooth, substantially structureless surface with only a few worm-like structures; 4: structured surface with a large number of worm-like structures; 5: highly structured surface with worm-like structures close together.

The formation of droplet traces caused by washing out the residual halogen from after-treated flexographic printing plates was determined visually.

3. Useful life of after-treatment solutions

The useful life of after-treatment solutions was determined as the maximum time after which these solutions still give the same result as freshly prepared solutions.

For the Examples and comparative experiments below, multilayer plates were produced as described in Example 3 of German Laid-Open Application DOS 2,942,183. These multilayer plates were used by way of example to illustrate the novel process. The use of these plates serves to illustrate the invention, which is not restricted to these plates but can also be applied to other plates. The plates were exposed to a negative. After the unexposed areas had been washed out with a 4:1 perchloroethylene N-butanol mixture, the resulting photopolymer flexographic printing plates were dried.

EXAMPLE 1

A photopolymer flexographic printing plate was immersed for 5 minutes at room temperature into a 0.4% strength aqueous bromine solution which additionally contained 0.5% by weight of a sodium paraffinsulfonate whose chain possesses 12 to 18 carbon atoms (e.g. emulsifier K 30). Thereafter, the flexographic printing plate was immersed in a 1% strength aqueous solution of sodium thiosulfate (neutralization bath), and the solution was allowed to act for 30 seconds. After this time, the flexographic printing plate was removed from the solution, and the liquid was allowed to drip off. The said plate was then dried by dabbing with a cloth. The relief surface of the after-treated flexographic printing plate was non-tacky (rating 1) and had a uniform smooth structureless surface (rating 1). The useful life of the surfactant-containing aqueous bromine solution was longer than 48 hours.

COMPARATIVE EXPERIMENT 1

The procedure described in Example 1 was followed, except that the 0.4% strength aqueous bromine solution and the 1% strength sodium thiosulfate solution (neutralization bath) did not contain any sodium paraffinsulfonate. A non-tacky relief surface (rating 1) exhibiting pronounced worm-like structures (rating 4–5) and droplet traces was obtained. The useful life of the bromine-containing after-treatment solution was longer than 48 hours.

EXAMPLE 2

The procedure described in Example 1 was followed, except that a sodium salt of a fatty alcohol ethersulfate (e.g. Lutensit ® AS 2230) was employed in the bromine bath and in the neutralization bath, in an amount of 1% by weight in each case. A non-tacky (rating 1) smooth, structureless (rating 1) relief surface was obtained. No droplet traces were present. The useful life of the bromine-containing after-treatment bath was 24 hours.

EXAMPLE 3

The procedure described in Example 1 was followed, except that, instead of the sodium paraffinsulfonate, an acidic sodium alkylphosphate (e.g. Lutensit A-EP) was employed in the bromine bath and in the neutralization bath, in an amount of 1% by weight in each case. A substantially non-tacky (rating 1–2), smooth, only slightly structured (rating 2) relief surface was obtained. No droplet traces were present. The useful life of the bromine bath was 24 hours.

COMPARATIVE EXPERIMENT 2

The procedure described in Example 1 was followed, except that an alkylphenol oxyethylate was employed in the bromine bath and in the neutralization bath, in an amount of 1% by weight in each case. A tacky (rating 4–5), highly structured (rating 4) relief surface was obtained. No droplet traces were detectable. The useful life of the bromine bath was less than 10 hours.

EXAMPLE 4

The procedure described in Example 1 was followed, except that a commercial potassium perfluoroalkylsulfonate (e.g. Fluorad ® FC 95) was employed in the bromine bath and in the neutralization bath, in an amount of 0.1% by weight in each case. A non-tacky (rating 1), smooth, structureless (rating 1) relief surface was obtained. No droplet traces were present. The useful life of the bromine bath was longer than 48 hours.

We claim:

1. A process for the preparation of a non-tacky, smooth surface of a photopolymer relief printing plate for flexographic printing, whose relief layer is prepared by
   (A) exposing a photosensitive photopolymerizable and/or photocrosslinkable relief-forming layer imagewise to actinic light, the said layer containing
      (a) one or more binders based on elastomeric diene polymers,
      (b) one or more olefinically unsaturated, photopolymerizable and/or photocrosslinkable monomers which are compatible with the said binders, and
      (c) one or more photoinitiators
      (d) and thereafter,
   (B) washing out the non-polymerized and/or non-crosslinked, unexposed areas with a suitable liquid medium,
   in which
   (C) the surface of the photopolymerized relief printing plate is after-treated with a liquid medium which contains one or more surfactants and elemental bromine or contains one or more surfactants and is capable of forming elemental bromine, and thereafter,
   (D) the surface of the photopolymerized relief printing plate is washed out with a neutralizing and/or reducing liquid medium,
   wherein the liquid media used for step C contain one or more surfactants from the group consisting of saturated paraffinsulfonates possessing a hydrocarbon chain of 8 to 20 carbon atoms, anionic or cationic surfactants possessing one or more perfluorinated carbon chains of 5 to 18 carbon atoms, fatty alcohol ethersulfates and alkyl phosphates.

2. The process of claim 1, wherein the liquid medium used for step C contains the saturated paraffinsulfonate, the anionic or cationic surfactant possessing a perfluorinated carbon chain, the fatty alcohol ethersulfate or the alkyl phosphate in amounts of from 0.001 to 1% by weight, based on the total amount of the liquid medium.

3. The process of claim 1, wherein the liquid medium used for step D, contains one or more saturated paraffinsulfonates possessing a carbon chain of 8 to 20 carbon atoms, an anionic or cationic surfactant processing one or more perfluorinated carbon chains of 5 to 18 carbon atoms, a fatty alcohol ethersulfate or an alkyl phosphate, in amounts of from 0.001 to 1% by weight, based on the total amount of the particular liquid medium.

4. The process of claim 1, wherein the photopolymerized relief printing plate is dried and post-exposed to actinic light.

* * * * *

UNITED STATES PATENT AND TRADEMARK OFFICE
CERTIFICATE OF CORRECTION

PATENT NO. : 4,725,528
DATED : February 16, 1988
INVENTOR(S) : KOCH et al.

It is certified that error appears in the above-identified patent and that said Letters Patent is hereby corrected as shown below:

Column 12, line 30 [processing] should be:

possessing.

Signed and Sealed this

Twenty-eighth Day of June, 1988

Attest:

DONALD J. QUIGG

Attesting Officer

Commissioner of Patents and Trademarks